United States Patent
Pelligra et al.

(10) Patent No.: US 12,549,145 B2
(45) Date of Patent: Feb. 10, 2026

(54) OFFSET VOLTAGE CANCELATION FOR A CHARGE AMPLIFICATION CIRCUIT

(71) Applicant: STMicroelectronics International N.V., Geneva (CH)

(72) Inventors: Giovanni Pelligra, Ragusa (IT); Alberto Giuseppe Cavallaro, Catania (IT); Tiziano Chiarillo, Mascalucia (IT)

(73) Assignee: STMicroelectronics International N.V., Geneva (CH)

( * ) Notice: Subject to any disclaimer, the term of this patent is extended or adjusted under 35 U.S.C. 154(b) by 56 days.

(21) Appl. No.: 18/611,889

(22) Filed: Mar. 21, 2024

(65) Prior Publication Data

US 2025/0300618 A1    Sep. 25, 2025

(51) Int. Cl.
*H03F 3/45*    (2006.01)

(52) U.S. Cl.
CPC ..... *H03F 3/45973* (2013.01); *H03F 3/45475* (2013.01); *H03F 2200/129* (2013.01); *H03F 2203/45138* (2013.01)

(58) Field of Classification Search
CPC ............. H03F 3/45973; H03F 3/45475; H03F 2200/129; H03F 2203/45138; G11C 7/062; G11C 7/06; H03K 5/2481; G01R 19/0038

See application file for complete search history.

(56) References Cited

U.S. PATENT DOCUMENTS

| | | | |
|---|---|---|---|
| 4,988,900 A | 1/1991 | Fensch | |
| 9,461,625 B1 | 10/2016 | Prandi et al. | |
| 2005/0017889 A1 | 1/2005 | Stockstad | |
| 2010/0164770 A1 | 7/2010 | Wan et al. | |
| 2010/0308935 A1* | 12/2010 | Visconti | H03H 11/126 333/173 |
| 2020/0033379 A1 | 1/2020 | Romano | |
| 2021/0313933 A1 | 10/2021 | Biswas | |
| 2022/0416743 A1 | 12/2022 | Modaffari et al. | |
| 2023/0188105 A1 | 6/2023 | Huang et al. | |

FOREIGN PATENT DOCUMENTS

CN        115514333 A        12/2022

OTHER PUBLICATIONS

EP Search Report and Written Opinion for counterpart EP Appl. No. 25160706.5, report dated Jul. 25, 2025, 11 pgs.

* cited by examiner

Primary Examiner — Jung Kim
(74) Attorney, Agent, or Firm — Crowe & Dunlevy LLC

(57) ABSTRACT

A circuit includes an amplifier, a bias voltage node, and a first set of switches configured, based on a first reset signal being asserted, to couple amplifier input nodes to the bias voltage node and to short-circuit amplifier output nodes. First and second feedback branches each include a respective circuit network including parallel capacitors, with first ones of the capacitors directly connected to the amplifier input nodes. The first and second feedback branches further include a second set of switches intermediate the amplifier input nodes and second ones of the capacitors, and a third set of switches intermediate amplifier output nodes and the capacitors. These switches selectively couple the capacitors to the amplifier input and output nodes, based on a second reset signal being asserted. The second reset signal is asserted for a time interval exceeding a time interval in which the first reset signal is asserted.

19 Claims, 11 Drawing Sheets

OFFSET VOLTAGE CANCELATION FOR A CHARGE AMPLIFICATION CIRCUIT

TECHNICAL FIELD

The present invention generally relates to a charge amplification circuit and, in particular, to an offset voltage cancelation for the charge amplification circuit.

One or more embodiments may be applied to a capacitive sensor (for example, a pressure sensor).

BACKGROUND

Charge amplifier circuits are suitable for a variety of electronic applications. For instance, they can be employed in readout chains of capacitive micro-electromechanical systems (MEMS) sensors (that is, sensors configured to transduce a variation of a given physical quantity into a capacitive displacement).

In this context, the charge amplifier is used to convert the variation of charge stored in capacitive elements into a voltage signal, facilitating processing of the signal by further signal processing chains. For instance, in case of a digital signal processing chain, the charge amplifier is coupled to an analog-to-digital converter (ADC) configured to provide a digital representation of the input voltage signal, optionally applying anti-aliasing filtering.

Existing charge amplifier arrangements may suffer from one or more of the following drawbacks: presence of an offset error leading to a deterioration in accuracy; growth of the detrimental effect of the offset error based on a reduction of the capacitance used in the feedback branch of the amplifier; and growth of the detrimental effect of the offset error based on an increase of the gain from the offset source.

SUMMARY

In an embodiment, a circuit comprises: an amplifier having a first input node and a second input node and having a first output node and a second output node; a bias voltage node; a first set of switches configured, in response to assertion of a first reset signal, to couple the first and second input nodes of the amplifier to the bias voltage node and to short circuit the first and second output nodes of the amplifier together; a first feedback branch coupled between the first output node and the first input node of the amplifier, the first feedback branch including: a first capacitor; and a second capacitor having a first terminal directly connected to the first input node of the amplifier; a second feedback branch coupled between the second output node and the second input node of the amplifier, the second feedback branch including: a third capacitor; and a fourth capacitor having a first terminal directly connected to the second input node of the amplifier; wherein each of the first and second feedback branches further includes: a second set of switches intermediate the first and second input nodes of the amplifier and the first and third capacitors; and a third set of switches intermediate the first and second output nodes of the amplifier and the first, second, third and fourth capacitors; wherein: switches in the second set of switches are configured to selectively couple the first capacitor in the first feedback branch and the third capacitor in the second feedback branch to the first and second input nodes of the amplifier, respectively, in response to assertion of a second reset signal; and switches in the third set of switches are configured to selectively couple the first capacitor in the first feedback branch and the third capacitor in the second feedback branch to the first and second output nodes of the amplifier, respectively, in response to assertion of the second reset signal; and wherein the first and second reset signals are asserted during a first phase, and wherein the first reset signal is de-asserted and the second reset signal is asserted during a second phase after the first phase.

In an embodiment of the circuit: switches in the third set of switches are further configured to selectively couple the second capacitor in the first feedback branch and the fourth capacitor in the second feedback branch to the bias voltage node in response to assertion of the second reset signal; switches in the third set of switches are further configured to selectively couple the second capacitor in the first feedback branch and the fourth capacitor in the second feedback branch to the first and second output nodes of the amplifier, respectively, in response to assertion of a third reset signal; and wherein the first reset signal is de-asserted, the second reset signal is de-asserted and the third reset signal is asserted during a third phase after the second phase.

The first, second and third phases are phases of a process for resetting the circuit following a power off.

BRIEF DESCRIPTION OF THE DRAWINGS

For a better understanding of the embodiments, reference will now be made by way of example only to the accompanying figures in which.

DETAILED DESCRIPTION

Figure 1:
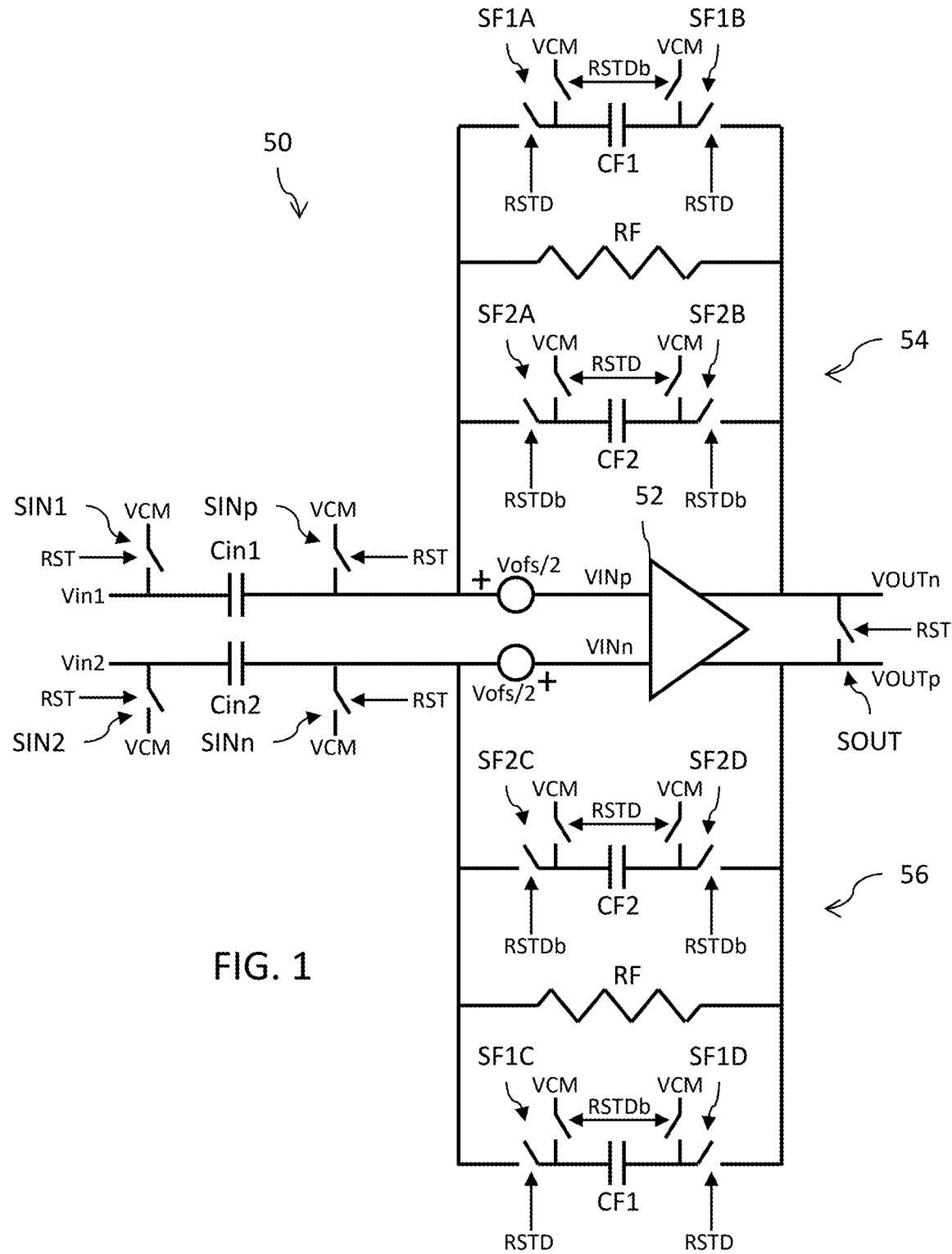
FIG. 1 is a circuit diagram for a charge amplification circuit.

Reference is made to FIG. 1 which shows a circuit diagram for a charge amplification circuit 50. The charge amplification circuit 50 includes an operational transconductance amplifier (OTA) 52 including: a first (e.g., non-inverting) input node VINp coupled, preferably directly connected, to a terminal of a first input capacitor Cin1 and coupled to a first output node VOUTn of the OTA 52 via a first feedback branch comprising a first RC network 54 including at least a first capacitor CF1, a second capacitor CF2 (where CF1=CF2), and first resistor RF connected in parallel therebetween; and a second (e.g., inverting) input node VINn coupled, preferably directly connected, to a second input capacitor Cin2 and coupled to a second output node VOUTp of the OTA 52 via a second feedback branch 56 comprising a second RC network also including at least a first capacitor CF1, a second capacitor CF2 (where CF1=CF2), and first resistor RF connected in parallel therebetween. The capacitances and resistances for the circuit elements of the first RC network 54 are equal, respectively, to the corresponding capacitances and resistances for the circuit elements of the second RC network 56.

A second terminal of the first input capacitor Cin1 is coupled, preferably directly connected, to a first input node Vin1. A second terminal of the second input capacitor Cin2 is coupled, preferably directly connected, to a second input node Vin2. An input voltage ΔVin generated by a sensor (such as a MEMS resistive or capacitive bridge sensor) is applied across the input nodes Vin1 and Vin2.

A common mode voltage node is configured to receive a common mode voltage level VCM.

A first set of reset switches SIN1, SIN2, SINp, SINn, SOUT are configured to be driven by a first reset signal RST. The reset switch SIN1 selectively couples the common mode voltage node to the second terminal of the first input capacitor Cin1 in response to assertion of the first reset signal RST. The reset switch SIN2 selectively couples the common mode voltage node to the second terminal of the second input capacitor Cin2 in response to assertion of the first reset signal RST. The reset switch SINp selectively couples the common mode voltage node to the first (non-inverting) input node VINp of the OTA 52 in response to assertion of the first reset signal RST. The reset switch SINn selectively couples the common mode voltage node to the second (inverting) input node VINn of the OTA 52 in response to assertion of the first reset signal RST. The reset switch SOUT selectively couples (i.e., shorts together) the first and second output nodes VOUTn and VOUTp of the OTA 52 in response to assertion of the first reset signal RST.

A second set of switches SF1A, SF2A, SF1C, SF2C and a third set of switches SF1B, SF2B, SF1D, SF2D are configured to be driven by a second reset signal RSTD and its logical complement RSTDb. The second set of switches SF1A, SF2A, SF1C, SF2C are positioned intermediate the first (non-inverting) and second (inverting) input nodes VinP and VINn of the OTA 52 and the capacitors CF1, CF2 of the first feedback branch 54 and second feedback branch 56. The third set of switches SF1B, SF2B, SF1D, SF2D are positioned intermediate the first and second output nodes VOUTn and VOUTp of the OTA 52 and the capacitors CF1, CF2 of the first feedback branch 54 and second feedback branch 56.

The switch SF1A selectively couples the left terminal of the first capacitor CF1 of the first feedback branch 54 to the first (non-inverting) input node VINp of the OTA 52 in response to assertion of the second reset signal RSTD, and selectively couples the left terminal of the first capacitor CF1 of the first feedback branch 54 to the common mode voltage node in response to assertion of the complement second reset signal RSTDb. The switch SF1B selectively couples the right terminal of the first capacitor CF1 of the first feedback branch 54 to the first output node VOUTn of the OTA 52 in response to assertion of the second reset signal RSTD, and selectively couples the right terminal of the first capacitor CF1 of the first feedback branch 54 to the common mode voltage node in response to assertion of the complement second reset signal RSTDb.

The switch SF2A selectively couples the left terminal of the second capacitor CF2 of the first feedback branch 54 to the first (non-inverting) input node VINp of the OTA 52 in response to assertion of the complement second reset signal RSTDb, and selectively couples the left terminal of the second capacitor CF2 of the first feedback branch 54 to the common mode voltage node in response to assertion of the second reset signal RSTD. The switch SF2B selectively couples the right terminal of the second capacitor CF2 of the first feedback branch 54 to the first output node VOUTn of the OTA 52 in response to assertion of the complement second reset signal RSTDb, and selectively couples the right terminal of the second capacitor CF2 of the first feedback branch 54 to the common mode voltage node in response to assertion of the second reset signal RSTD.

The switch SF1C selectively couples the left terminal of the first capacitor CF1 of the second feedback branch 56 to the second (inverting) input node VINn of the OTA 52 in response to assertion of the second reset signal RSTD, and selectively couples the left terminal of the first capacitor CF1 of the second feedback branch 56 to the common mode voltage node in response to assertion of the complement second reset signal RSTDb. The switch SF1D selectively couples the right terminal of the first capacitor CF1 of the second feedback branch 56 to the second output node VOUTp of the OTA 52 in response to assertion of the second reset signal RSTD, and selectively couples the right terminal of the first capacitor CF1 of the second feedback branch 56 to the common mode voltage node in response to assertion of the complement second reset signal RSTDb.

The switch SF2C selectively couples the left terminal of the second capacitor CF2 of the second feedback branch 56 to the second (inverting) input node VINn of the OTA 52 in response to assertion of the complement second reset signal RSTDb, and selectively couples the left terminal of the second capacitor CF2 of the second feedback branch 56 to the common mode voltage node in response to assertion of the second reset signal RSTD. The switch SF2D selectively couples the right terminal of the second capacitor CF2 of the second feedback branch 56 to the second output node VOUTp of the OTA 52 in response to assertion of the complement second reset signal RSTDb, and selectively couples the right terminal of the second capacitor CF2 of the second feedback branch 56 to the common mode voltage node in response to assertion of the second reset signal RSTD.

Figure 2:
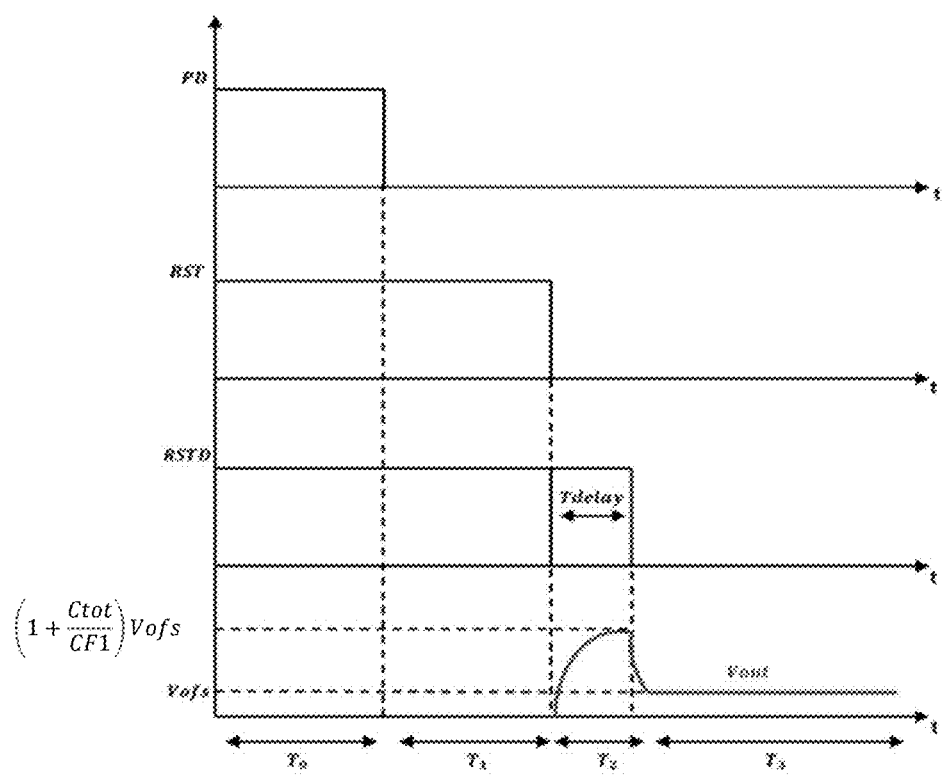
FIG. 2 is a timing diagram for signals of the charge amplification circuit of FIG. 1 during phases of the reset process.

A process for performing a reset of the OTA 52 at start-up includes an initial phase T0 where circuit 50 is in power down (see FIG. 2).

Figure 1A:
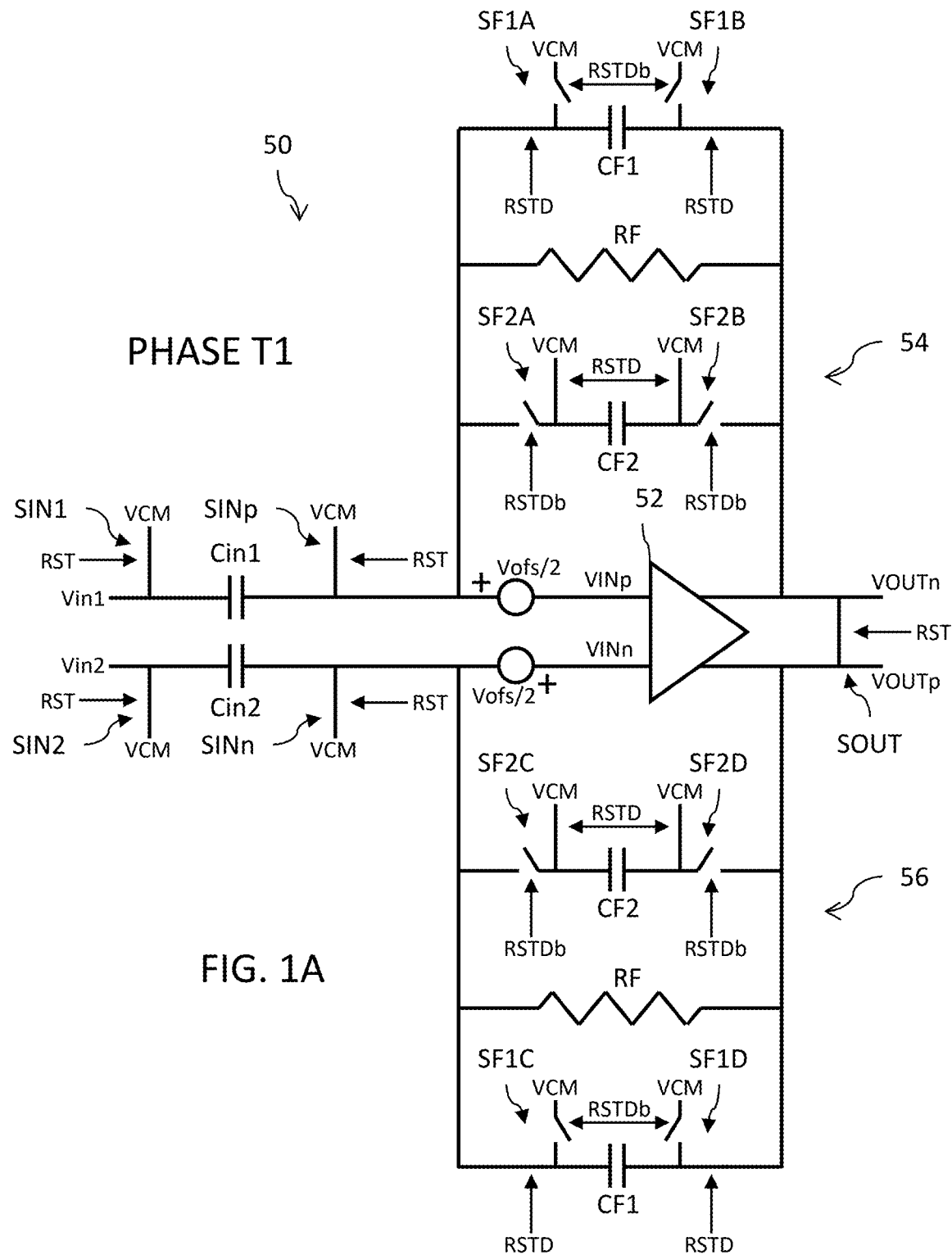
FIGS. 1A-1C show the switching configuration of the charge amplification circuit of FIG. 1 in three consecutive phases of a reset process.

In a first phase T1 of the reset process (see FIGS. 1A and 2), power is applied to the circuit 50 (in response to a transition to logic low for the power control signal PD which controls a power supply circuit for the amplifier) and the first reset signal RST is asserted, the second reset signal RSTD is asserted and the complement second reset signal RSTDb is not asserted. In this first phase T1, the first set of reset switches SIN1, SIN2, SINp, SINn, SOUT are all controlled to be in the closed state. So, the second terminals of the first and second input capacitors Cin1, Cin2 of the capacitive sensor CS are coupled to receive the common mode voltage VCM. Also, the first (non-inverting) input node VINp and second (inverting) input node VINn of the OTA 52 are coupled to receive the common mode voltage VCM. Furthermore, the first and second output nodes VOUTn and VOUTp of the OTA 52 are short circuited together. In this first phase T1, the switches SF1A, SF1B, SF1C, SF1D of the second set of switches are controlled by the assertion of the second reset signal RSTD to couple the left and right terminals of the first capacitors CF1 of the first and second feedback branches to the inputs and outputs of the OTA 52. Additionally, the switches SF2A, SF2B, SF2C, SF2D of the second set of switches are controlled by the assertion of the second reset signal RSTD to couple the left and right terminals of the second capacitors CF2 of the first and second feedback branches to the common mode voltage VCM.

Figure 1B:
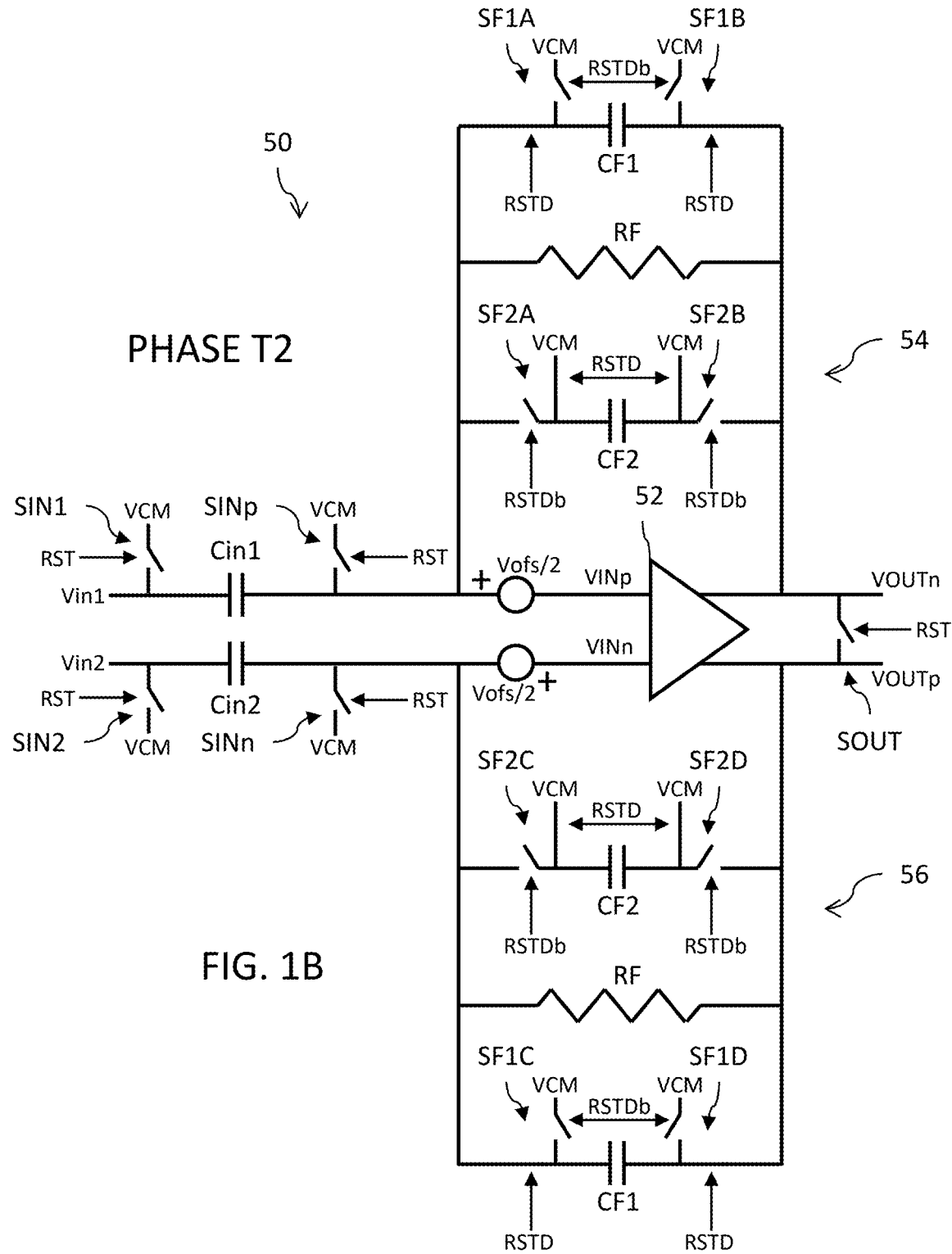

In a second phase T2 of the reset process (see FIGS. 1B and 2), the first reset signal RST is de-asserted, the second reset signal RSTD remains asserted and the complement second reset signal RSTDb remains de-asserted. In this second phase T2, the first set of reset switches SIN1, SIN2, SINp, SINn, SOUT are all controlled to the open state. So, the second terminals of the first and second input capacitors Cin1, Cin2 of the capacitive sensor CS are no longer coupled to receive the common mode voltage VCM. Also, the first (non-inverting) input node VINp and second (inverting) input node VINn of the OTA 52 are no longer coupled to receive the common mode voltage VCM. Furthermore, the first and second output nodes VOUTn and VOUTp of the OTA 52 are no longer short circuited together. The assertion of the second reset signal RSTD continues to cause the switches SF1A, SF1B, SF1C, SF1D of the second set of switches to couple the left and right terminals of the first capacitors CF1 of the first and second feedback branches to the inputs and outputs of the OTA 52. The assertion of the second reset signal RSTD continues to cause the switches SF2A, SF2B, SF2C, SF2D of the second set of switches to couple the left and right terminals of the second capacitors CF2 of the first and second feedback branches to the common mode voltage VCM.

With this second phase T2, the offset voltage Vofs of the OTA 52 (schematically represented in FIG. 1 by two voltage sources Vofs/2 at the first (non-inverting) input node VINp and second (inverting) input node VINn of the OTA 52) is transferred to generate an output voltage Vout at the first and second output nodes VOUTn and VOUTp of the OTA 52 and amplified by a factor equal to:

$$Vout = \left(1 + \frac{Ctot}{CF1}\right)Vofs$$

Where: Ctot=2Cin+Cg+Cpar and represents a total capacitance of a virtual ground at the first and second input nodes of the amplifier 52, and where: Cin is the capacitance of the input capacitors Cin1, Cin2; Cg is input (gate) capacitance of the OTA 52; and Cpar is a parasitic capacitance of the sensor to which the charge amplification circuit 50 is connected.

In the second phase T2, a charge equal to Ctot·Vofs is stored in the capacitor Ctot and a charge equal to (CF1+Ctot) Vofs is stored in the capacitor CF1. The capacitor CF2 is discharged to the common mode voltage.

Figure 1C:
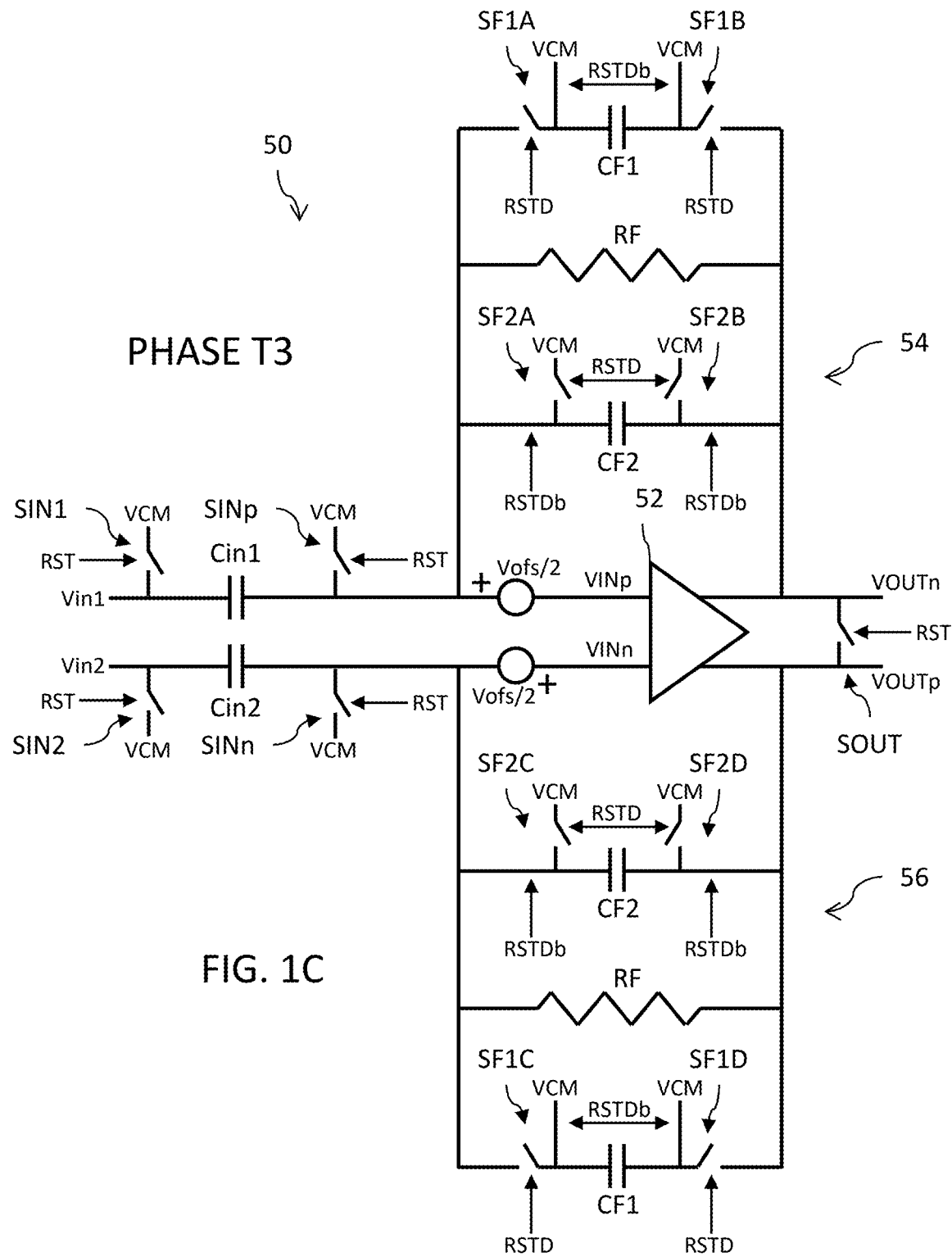

In a third phase T3 of the reset process (see FIGS. 1C and 2), the first reset signal RST remains de-asserted, the second reset signal RSTD is de-asserted and the complement second reset signal RSTDb is asserted. In this third phase T3, the first set of reset switches SIN1, SIN2, SINp, SINn, SOUT are all open. The second terminals of the first and second input capacitors Cin1, Cin2 of the capacitive sensor CS are disconnected from the common mode voltage VCM, and the first (non-inverting) input node VINp and second (inverting) input node VINn of the OTA 52 are disconnected from the common mode voltage VCM. In the third phase T3, the switches SF1A, SF1B, SF1C, SF1D of the second set of switches are controlled by the assertion of the complement second reset signal RSTDb to couple the left and right terminals of the first capacitors CF1 of the first and second feedback branches to the common mode voltage VCM.

Additionally, the switches SF2A, SF2B, SF2C, SF2D of the second set of switches are controlled by the assertion of the complement second reset signal RSTDb to couple the left and right terminals of the second capacitors CF2 of the first and second feedback branches to the inputs and outputs of the OTA 52.

The capacitors CF1 of the first and second feedback branches are disconnected from the OTA 52, discharged to the common mode voltage, and replaced for connection in the feedback branches by the capacitors CF2. The offset voltage Vofs of the OTA 52 is transferred to the first and second output nodes VOUTn and VOUTp of the OTA 52 to generate an output voltage Vout in accordance with the following:

$$Vout = \left(1 + \frac{Ctot}{CF1}\right)Vofs - \frac{Ctot}{CF2}Vofs$$

From the foregoing equation, it will be noted that once start-up is completed at the end of the third phase T3, the voltage Vout at the first and second output nodes VOUTn and VOUTp will reach (within a time defined by the bandwidth of the amplifier) a steady state non-zero voltage level. Accordingly, there is a noted drawback in that the foregoing multi-phase reset process cannot guarantee a complete cancelation of the offset voltage Vofs of the OTA 52 (see, FIG. 2).

Figure 3:
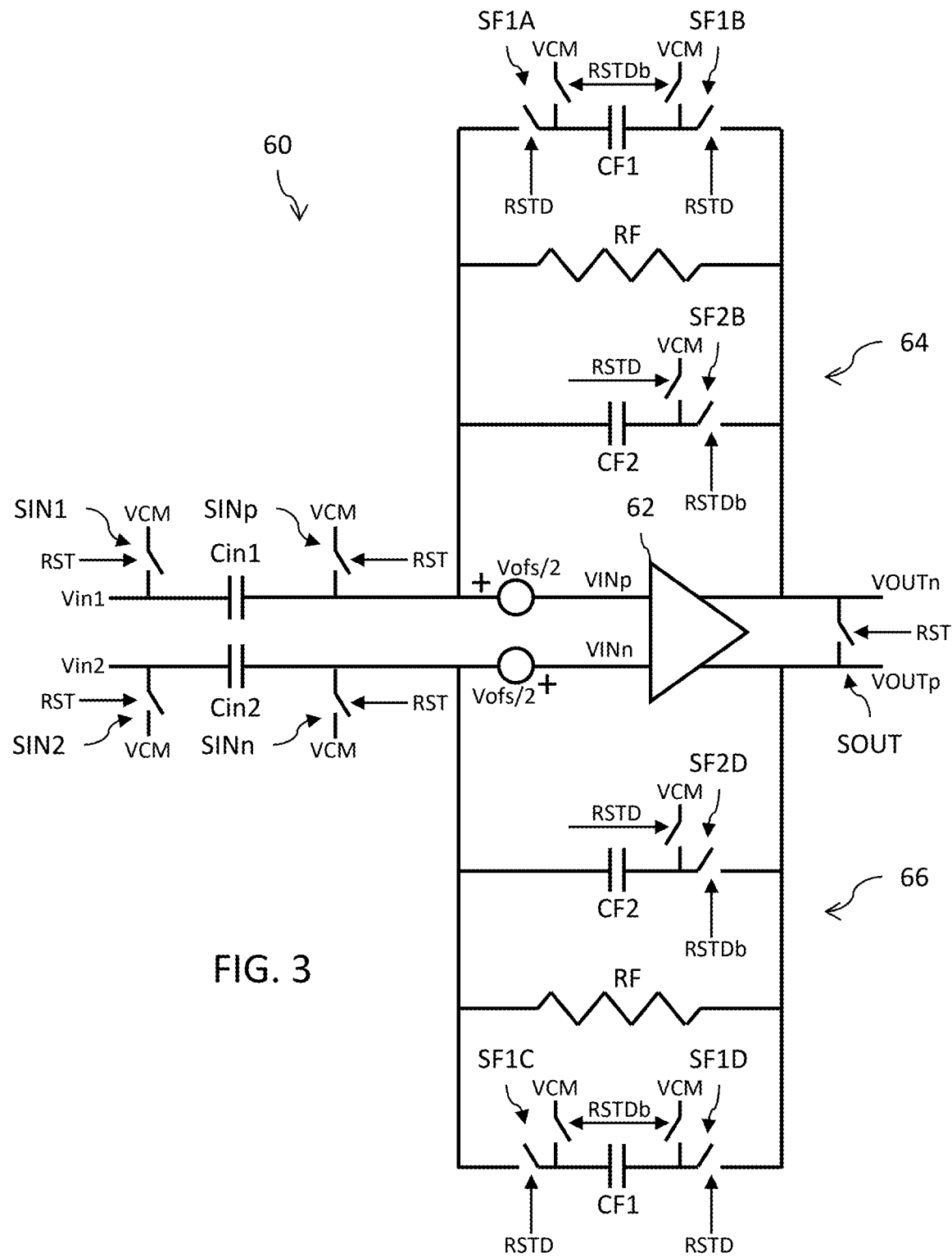
FIG. 3 is a circuit diagram for a charge amplification circuit with improved offset voltage cancelation.
Figure 4A:
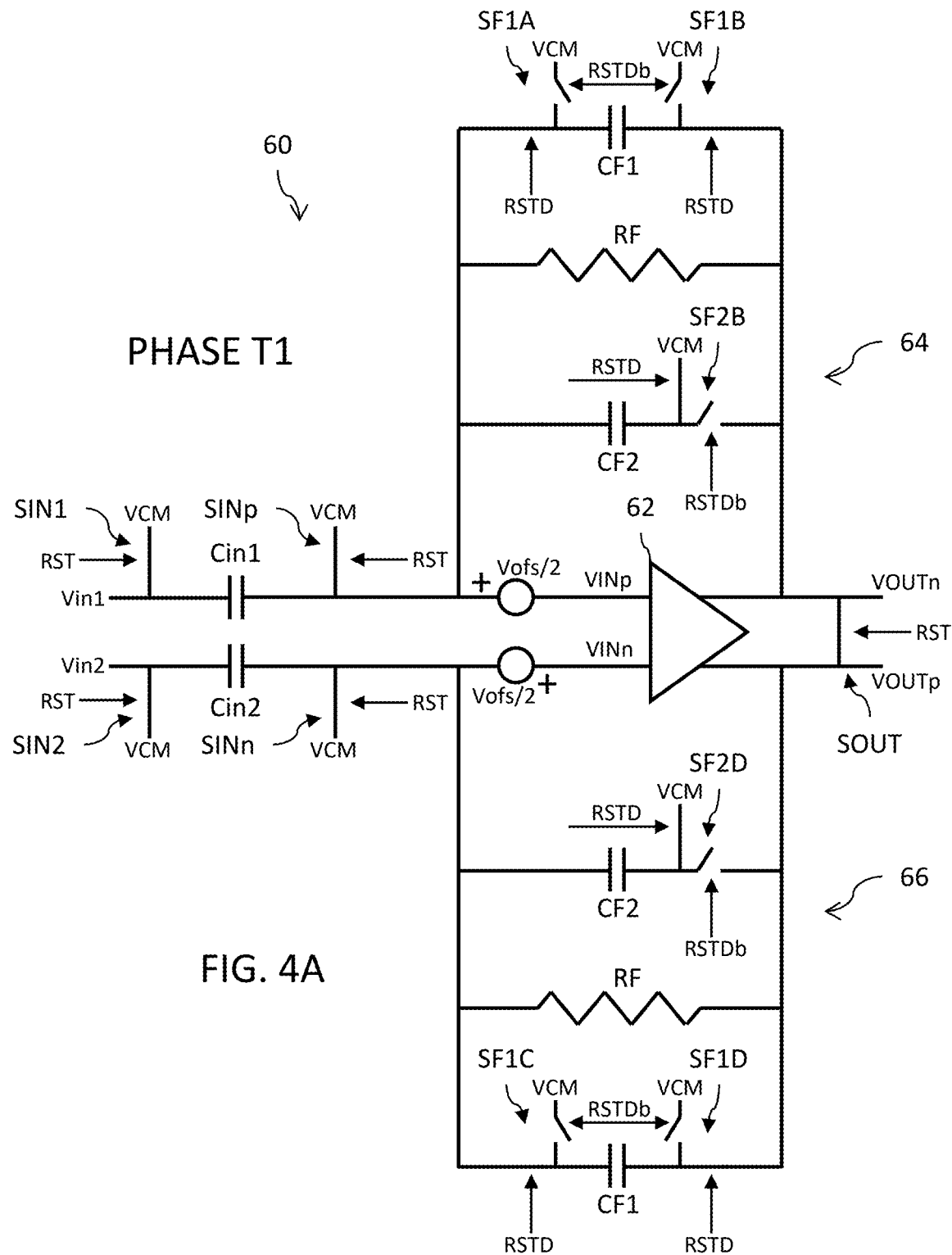
FIGS. 4A-4C show the switching configuration of the charge amplification circuit of FIG. 3 in three consecutive phases of a reset process.
Figure 4B:
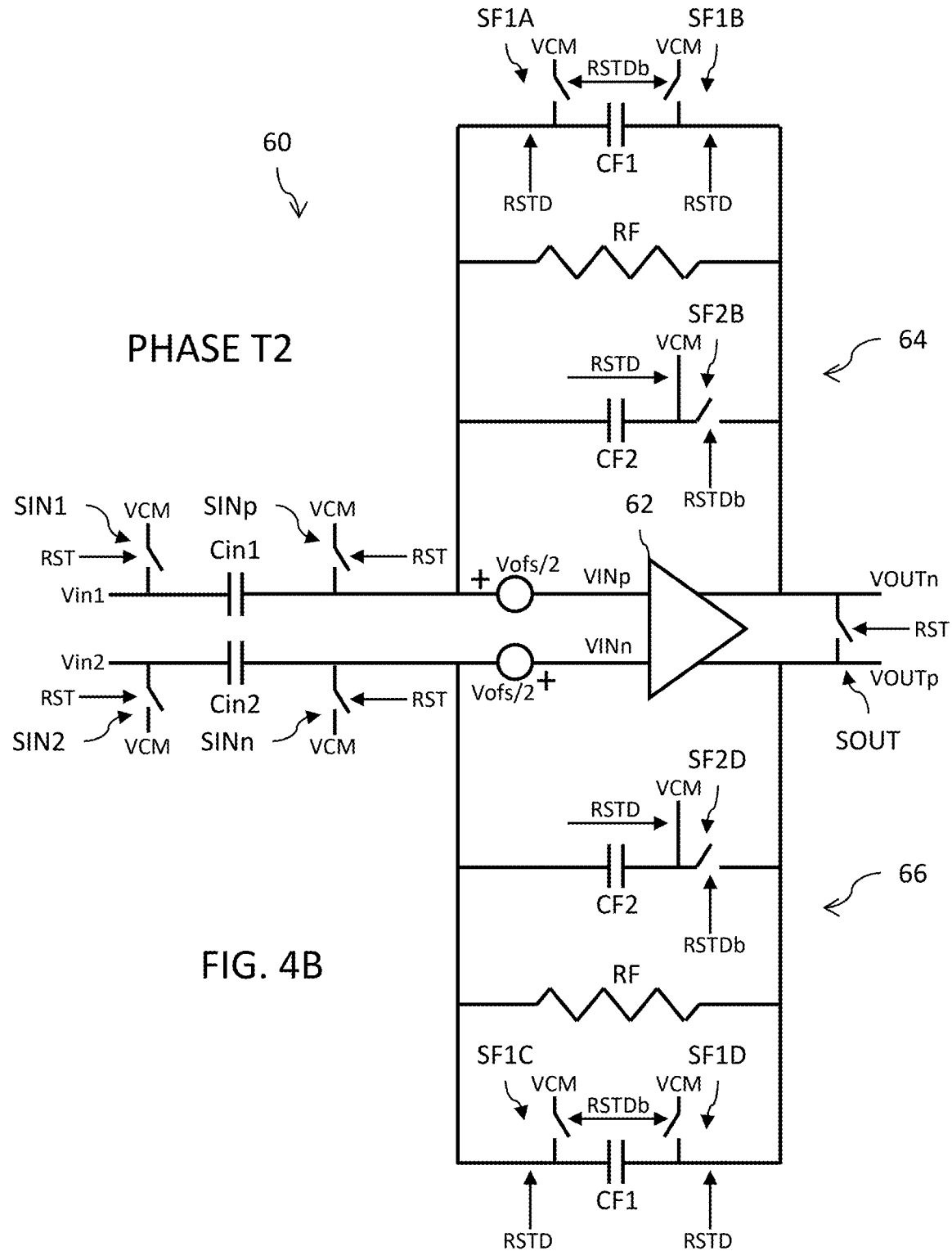
Figure 4C:
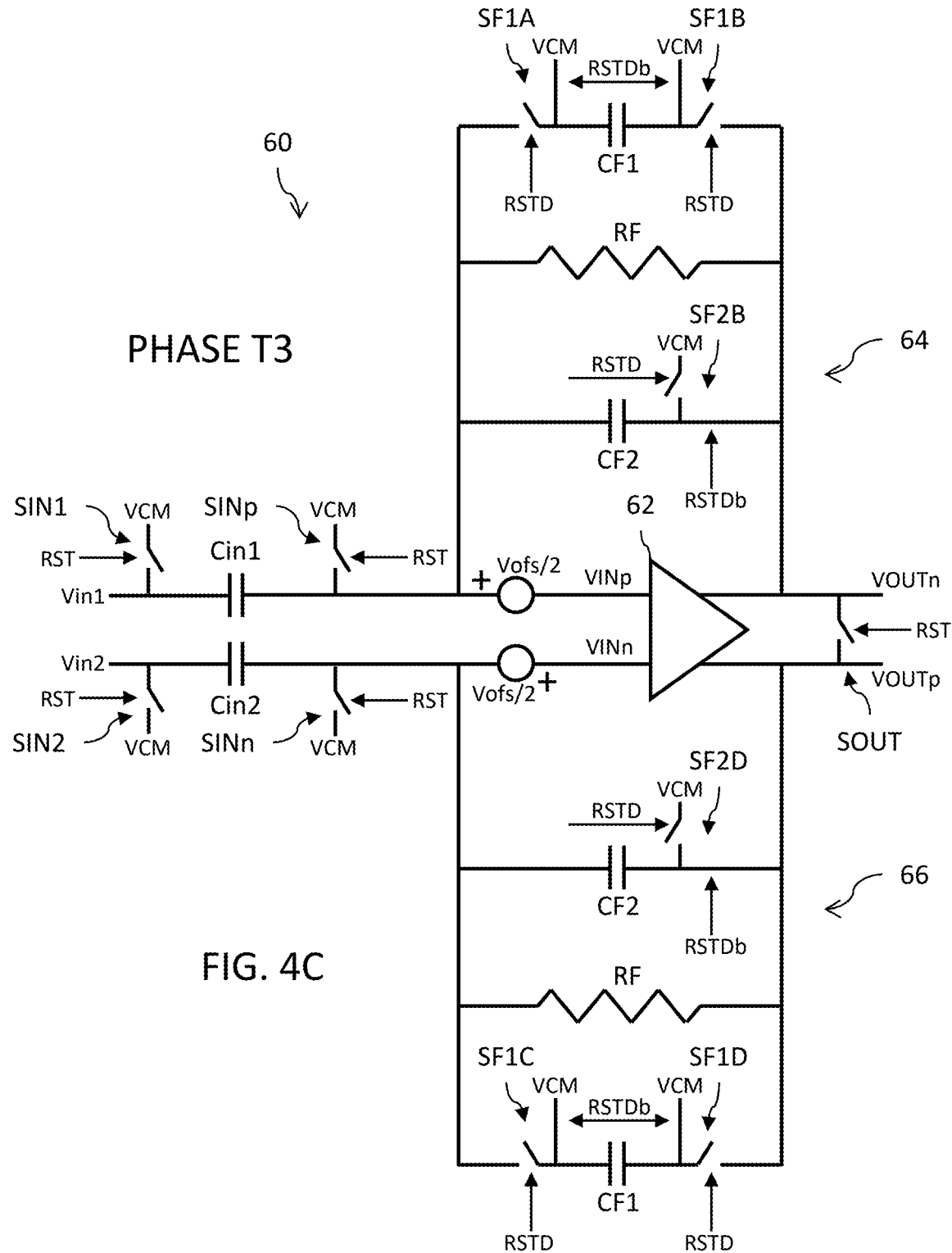

Reference is now made to FIG. 3 which shows a circuit diagram for a charge amplification circuit 60 with improved offset voltage cancelation using an auto-zeroing offset cancelation technique. The charge amplification circuit 60 includes an operational transconductance amplifier (OTA) 62 including: a first (e.g., non-inverting) input node VINp coupled, preferably directly connected, to a terminal of a first input capacitor Cin1 and coupled to a first output node VOUTn of the OTA 62 via a first feedback branch comprising a first RC network 64 including at least a first capacitor CF1, a second capacitor CF2 (where CF1=CF2), and first resistor RF connected in parallel therebetween; and a second (e.g., inverting) input node VINn coupled, preferably directly connected, to a second input capacitor Cin2 and coupled to a second output node VOUTp of the OTA 62 via a second feedback branch 66 comprising a second RC network also including at least a first capacitor CF1, a second capacitor CF2 (where CF1-CF2), and first resistor RF connected in parallel therebetween. The capacitances and resistances for the circuit elements of the first RC network 64 are equal, respectively, to the corresponding capacitances and resistances for the circuit elements of the second RC network 66.

A second terminal of the first input capacitor Cin1 is coupled, preferably directly connected, to a first input node Vin1. A second terminal of the second input capacitor Cin2 is coupled, preferably directly connected, to a second input node Vin2. An input voltage ΔVin generated by a sensor (such as a MEMS resistive or capacitive bridge sensor) is applied across the input nodes Vin1 and Vin2.

A common mode voltage node is configured to receive a common mode voltage level VCM.

A first set of reset switches SIN1, SIN2, SINp, SINn, SOUT are configured to be driven by a first reset signal RST. The reset switch SIN1 selectively couples the common mode voltage node to the second terminal of the first input capacitor Cin1 in response to assertion of the first reset signal RST. The reset switch SIN2 selectively couples the common mode voltage node to the second terminal of the second input capacitor Cin2 in response to assertion of the first reset signal RST. The reset switch SINp selectively couples the common mode voltage node to the first (non-inverting) input node VINp of the OTA 62 in response to assertion of the first reset signal RST. The reset switch SINn selectively couples the common mode voltage node to the second (inverting) input node VINn of the OTA 62 in response to assertion of the first reset signal RST. The reset switch SOUT selectively couples (i.e., shorts together) the first and second output nodes VOUTn and VOUTp of the OTA 62 in response to assertion of the first reset signal RST.

A second set of switches SF1A, SF1C, and a third set of switches SF1B, SF2B, SF1D, SF2D are configured to be driven by a second reset signal RSTD and its logical complement RSTDb. The second set of switches SF1A, SF1C are positioned intermediate the first (non-inverting) and second (inverting) input nodes VinP and VINn of the OTA 62 and the capacitors CF1 of the first feedback branch 64 and second feedback branch 66. The third set of switches SF1B, SF2B, SF1D, SF2D are positioned intermediate the first and second output nodes VOUTn and VOUTp of the OTA 62 and the capacitors CF1, CF2 of the first feedback branch 64 and second feedback branch 66.

It will be noted, in comparison with the circuit 50 of FIG. 1, the circuit 60 of FIG. 3 does not include the switches SF2A and SF2C in the second set of switches. The benefit of replacing the switches SF2A and SF2C shown in FIG. 1 with permanent short circuits to the differential inputs of the OTA 62 as shown in FIG. 3 will be discussed in detail below.

The switch SF1A selectively couples the left terminal of the first capacitor CF1 of the first feedback branch 64 to the first (non-inverting) input node VINp of the OTA 62 in response to assertion of the second reset signal RSTD, and selectively couples the left terminal of the first capacitor CF1 of the first feedback branch 64 to the common mode voltage node in response to assertion of the complement second reset signal RSTDb. The switch SF1B selectively couples the right terminal of the first capacitor CF1 of the first feedback branch 64 to the first output node VOUTn of the OTA 62 in response to assertion of the second reset signal RSTD, and selectively couples the right terminal of the first capacitor CF1 of the first feedback branch 64 to the common mode voltage node in response to assertion of the complement second reset signal RSTDb.

In the absence of the switch SF2A (see, FIG. 1), the left terminal of the second capacitor CF2 of the first feedback branch 64 is directly connected (short circuited) to the first (non-inverting) input node VINp of the OTA 62 (i.e., the terminal of the second capacitor CF2 is directly connected to the virtual ground of the charge amplifier 60). The switch SF2B selectively couples the right terminal of the second capacitor CF2 of the first feedback branch 64 to the first output node VOUTn of the OTA 62 in response to assertion of the complement second reset signal RSTDb, and selectively couples the right terminal of the second capacitor CF2 of the first feedback branch 64 to the common mode voltage node in response to assertion of the second reset signal RSTD.

The switch SF1C selectively couples the left terminal of the first capacitor CF1 of the second feedback branch 66 to the second (inverting) input node VINn of the OTA 62 in response to assertion of the second reset signal RSTD, and selectively couples the left terminal of the first capacitor CF1 of the second feedback branch 66 to the common mode voltage node in response to assertion of the complement second reset signal RSTDb. The switch SF1D selectively couples the right terminal of the first capacitor CF1 of the second feedback branch 66 to the second output node VOUTp of the OTA 62 in response to assertion of the second reset signal RSTD, and selectively couples the right terminal of the first capacitor CF1 of the second feedback branch 66 to the common mode voltage node in response to assertion of the complement second reset signal RSTDb.

In the absence of the switch SF2C (see, FIG. 1), the left terminal of the second capacitor CF2 of the second feedback branch 66 is directly connected (short circuited) to the second (inverting) input node VINn of the OTA 62 (i.e., the terminal of the second capacitor CF2 is directly connected to the virtual ground of the charge amplifier 60). The switch SF2D selectively couples the right terminal of the second capacitor CF2 of the second feedback branch 66 to the second output node VOUTp of the OTA 62 in response to assertion of the complement second reset signal RSTDb, and selectively couples the right terminal of the second capacitor CF2 of the second feedback branch 66 to the common mode voltage node in response to assertion of the second reset signal RSTD.

Figure 5:
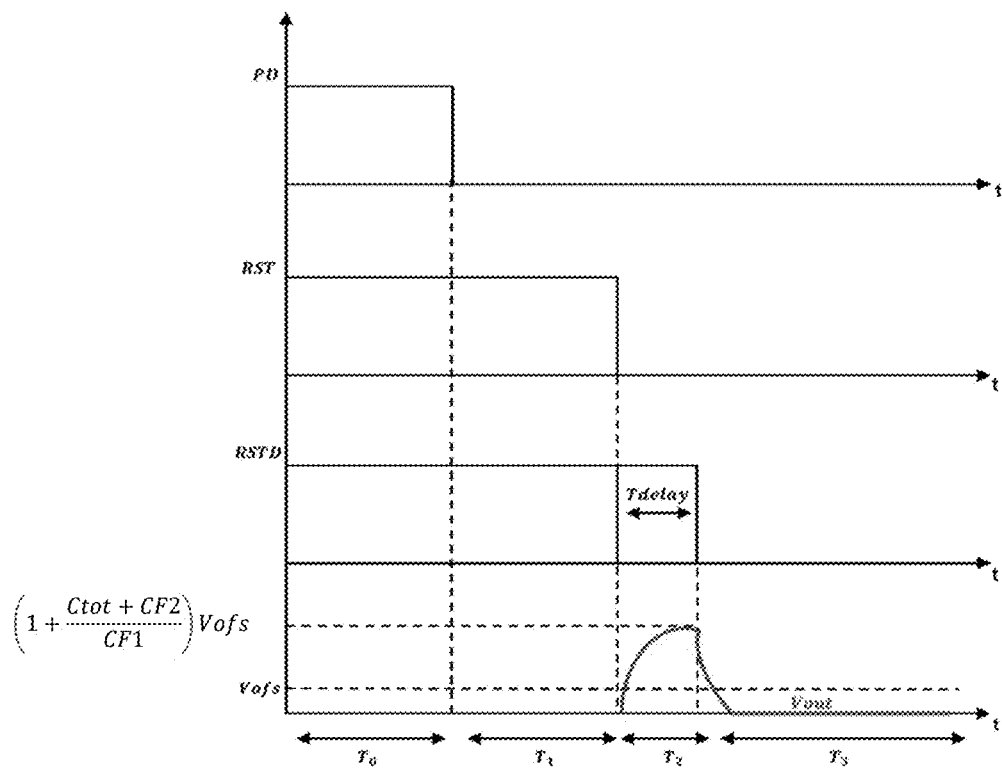
FIG. 5 is timing diagram for signals of the charge amplification circuit of FIG. 3 during phases of the reset process.

A process for performing a reset of the OTA 62 at start-up includes an initial phase T0 where circuit 60 is in power down (see, FIG. 5).

In a first phase T1 of the reset process (see FIGS. 3A and 5), power is applied to the circuit 60 (in response to a transition to logic low for the power control signal PD which controls a power supply circuit for the amplifier) and the first reset signal RST is asserted, the second reset signal RSTD is asserted and the complement second reset signal RSTDb is not asserted. In this first phase T1, the first set of reset switches SIN1, SIN2, SINp, SINn, SOUT are all controlled to be in the closed state. So, the second terminals of the first and second input capacitors Cin1, Cin2 of the capacitive sensor CS are coupled to receive the common mode voltage VCM. Also, the first (non-inverting) input node VINp and second (inverting) input node VINn of the OTA 62 are coupled to receive the common mode voltage VCM. Furthermore, the first and second output nodes VOUTn and VOUTp of the OTA 62 are short circuited together. As a result, there is a nulling of the differential signal and the correct bias point is reached for the effect of the output common-mode feedback (OCMFB). In this first phase T1, the switches SF1A, SF1B, SF1C, SF1D of the second set of switches are controlled by the assertion of the second reset signal RSTD to couple the left and right terminals of the first capacitors CF1 of the first and second feedback branches to the inputs and outputs of the OTA 62. Additionally, the switches SF2B, SF2D of the second set of switches are controlled by the assertion of the second reset signal RSTD to couple the right terminals of the second capacitors CF2 of the first and second feedback branches to the common mode voltage VCM. The left terminals of the second capacitors CF2 of the first and second feedback branches are directly connected to the first (non-inverting) input node VINp and second (inverting) input node VINn of the OTA 62.

In a second phase T2 of the reset process (see FIGS. 3B and 5), the first reset signal RST is de-asserted, the second reset signal RSTD remains asserted and the complement second reset signal RSTDb remains de-asserted. In this second phase T2, the first set of reset switches SIN1, SIN2, SINp, SINn, SOUT are all controlled to the open state. So, the second terminals of the first and second input capacitors Cin1, Cin2 of the capacitive sensor CS are no longer coupled to receive the common mode voltage VCM. Also, the first (non-inverting) input node VINp and second (inverting) input node VINn of the OTA 52 are no longer coupled to receive the common mode voltage VCM. Furthermore, the first and second output nodes VOUTn and VOUTp of the OTA 52 are no longer short circuited together. The assertion of the second reset signal RSTD continues to cause the switches SF1A, SF1B, SF1C, SF1D of the second set of switches to couple the left and right terminals of the first capacitors CF1 of the first and second feedback branches to the inputs and outputs of the OTA 52. The assertion of the second reset signal RSTD continues to cause the switches SF2B, SF2D of the second set of switches to couple the right terminals of the second capacitors CF2 of the first and second feedback branches to the common mode voltage VCM, with the left terminals of the second capacitors CF2 of the first and second feedback branches directly connected to the first (non-inverting) input node VINp and second (inverting) input node VINn of the OTA 62.

With this second phase T2, the offset voltage Vofs of the OTA 62 (schematically represented in FIG. 3 by two voltage sources Vofs/2 at the first (non-inverting) input node VINp and second (inverting) input node VINn of the OTA 32) is transferred to generate an output voltage Vout at the first and second output nodes VOUTn and VOUTp of the OTA 32 and amplified by a factor equal to:

$$Vout = \left(1 + \frac{Ctot + CF2}{CF1}\right) Vofs$$

Where: Ctot=2Cin+Cg+Cpar and represents a total capacitance of a virtual ground at the first and second input nodes of the amplifier 52, and where: Cin is the capacitance of the input capacitors Cin1, Cin2; Cg is input (gate) capacitance of the OTA 62; and Cpar is a parasitic capacitance of the sensor to which the charge amplification circuit 60 is connected.

In the second phase T2, a charge equal to Ctot·Vofs is stored in the capacitor Ctot, a charge equal to (CF1+Ctot) Vofs is stored in the capacitor CF1, a charge equal to Cin·Vofs is stored in the input capacitor Cin, and a charge equal to CF2·Vofs is stored in the capacitor CF2.

In a third phase T3 of the reset process (see FIGS. 3C and 5), the first reset signal RST remains de-asserted, the second reset signal RSTD is de-asserted and the complement second reset signal RSTDb is asserted. In this third phase T3, the first set of reset switches SIN1, SIN2, SINp, SINn, SOUT are all open. The second terminals of the first and second input capacitors Cin1, Cin2 of the capacitive sensor CS are disconnected from the common mode voltage VCM, and the first (non-inverting) input node VINp and second (inverting) input node VINn of the OTA 52 are disconnected from the common mode voltage VCM. In the third phase T3, the switches SF1A, SF1B, SF1C, SF1D of the second set of switches are controlled by the assertion of the complement second reset signal RSTDb to couple the left and right terminals of the first capacitors CF1 of the first and second feedback branches to the common mode voltage VCM. Additionally, the switches SF2B, SF2D of the second set of switches are controlled by the assertion of the complement second reset signal RSTDb to couple the right terminals of the second capacitors CF2 of the first and second feedback branches to the outputs of the OTA 62, with the left terminals of the second capacitors CF2 of the first and second feedback branches directly connected to the first (non-inverting) input node VINp and second (inverting) input node VINn of the OTA 62.

The capacitors CF1 of the first and second feedback branches are disconnected from the OTA 62, discharged to the common mode voltage, and replaced for connection in the feedback branches by the capacitors CF2. The offset voltage Vofs of the OTA 62 is transferred to the first and second output nodes VOUTn and VOUTp of the OTA 62 to generate an output voltage Vout in accordance with the following:

$$Vout = \left(1 + \frac{Ctot}{CF1}\right) Vofs - \frac{Ctot}{CF2} Vofs - Vofs = 0$$

From the foregoing equation, it will be noted that once start-up is completed at the end of the third phase T3, the voltage Vout at the first and second output nodes VOUTn and VOUTp will reach a voltage level equal to zero and will stay at zero for a limited time compared to the time constant RF*CF2. In other words, the foregoing multi-phase reset process produces a complete cancelation of the offset voltage Vofs of the OTA 62 (see, FIG. 5).

Figure 6:
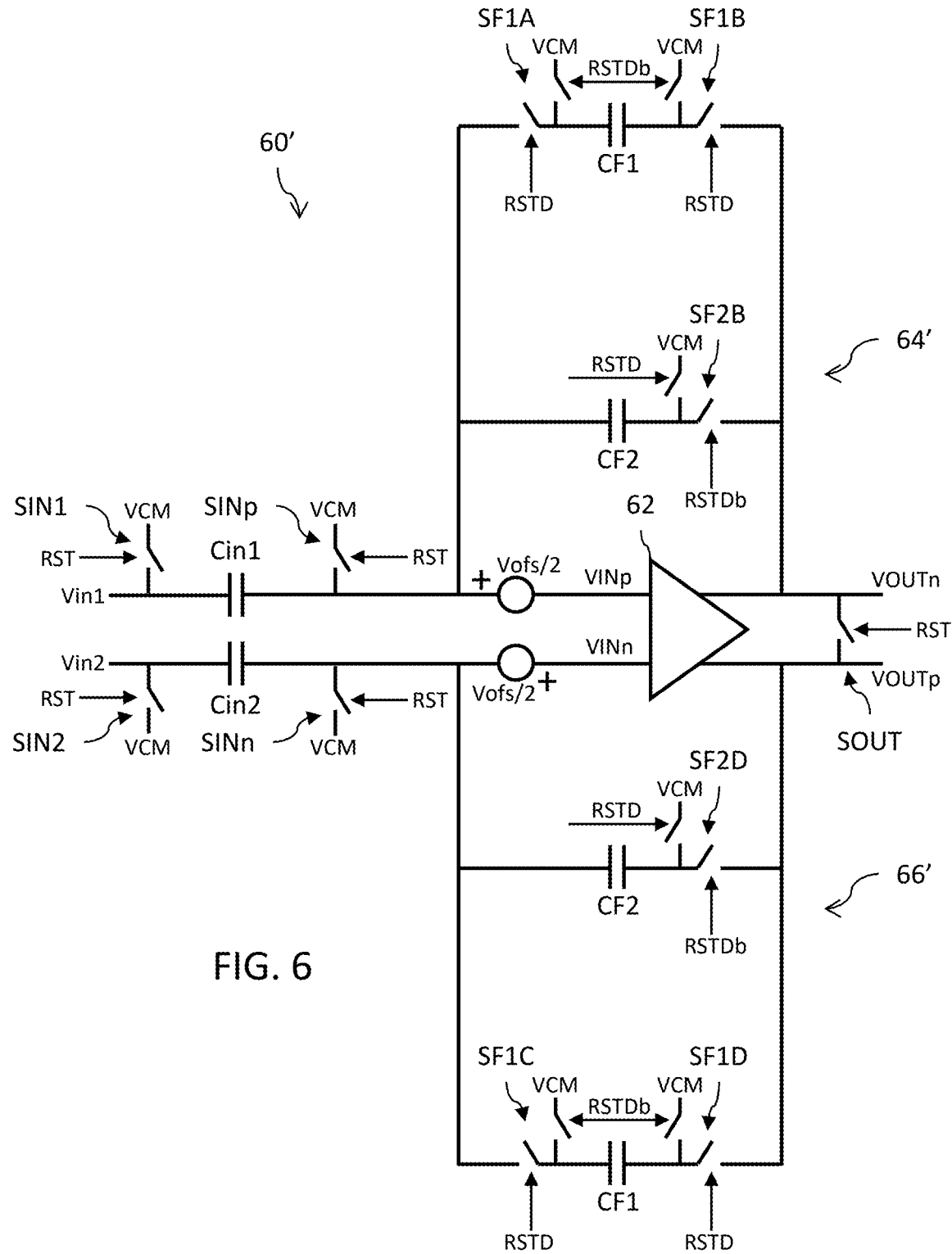
FIG. 6 is a circuit diagram for another implementation of a charge amplification circuit with improved offset voltage cancelation.

Reference is now made to FIG. 6 which shows a circuit diagram for another implementation of a charge amplification circuit 60' with improved offset voltage cancelation using an auto-zeroing offset cancelation technique. Like references in FIGS. 3 and 6 refer to same or similar components, the description of which will not be repeated here for sake of brevity. The charge amplification circuit 60' (FIG. 6) differs from the charge amplification circuit 60 (FIG. 3) in that the feedback resistors RF are omitted in the circuits 64' and 66'. The feedback resistors RF in RC circuits 64, 66 of FIG. 3 typically have a resistance value in order of giga-ohms. These resistors RF are used to set the input common mode of the charge amplification circuit. Because the circuits 60, 60' are configured to operate in ON-OFF mode, it is possible to omit the resistors RF as shown in FIG. 6 as setting the input common mode is not a requirement. An advantage of this FIG. 6 circuit 60' configuration over the FIG. 3 circuit 60 configuration is that the noise introduced by the resistors RF can accordingly be reduced.

Figure 7A:
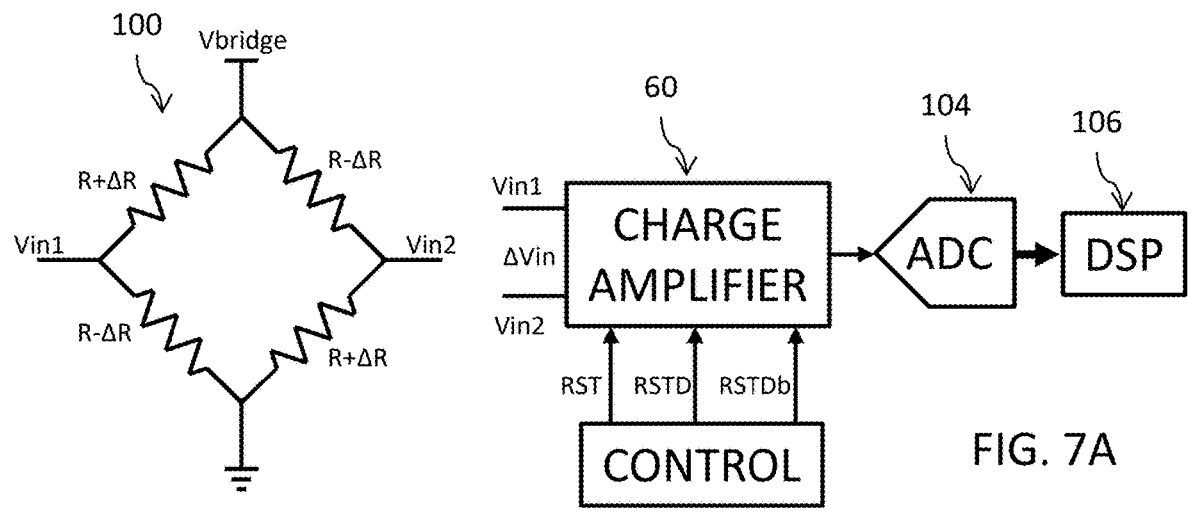
FIGS. 7A and 7B each show a block diagram of a sensing circuit configured to utilize the charge amplification circuit of FIG. 3.
Figure 7B:
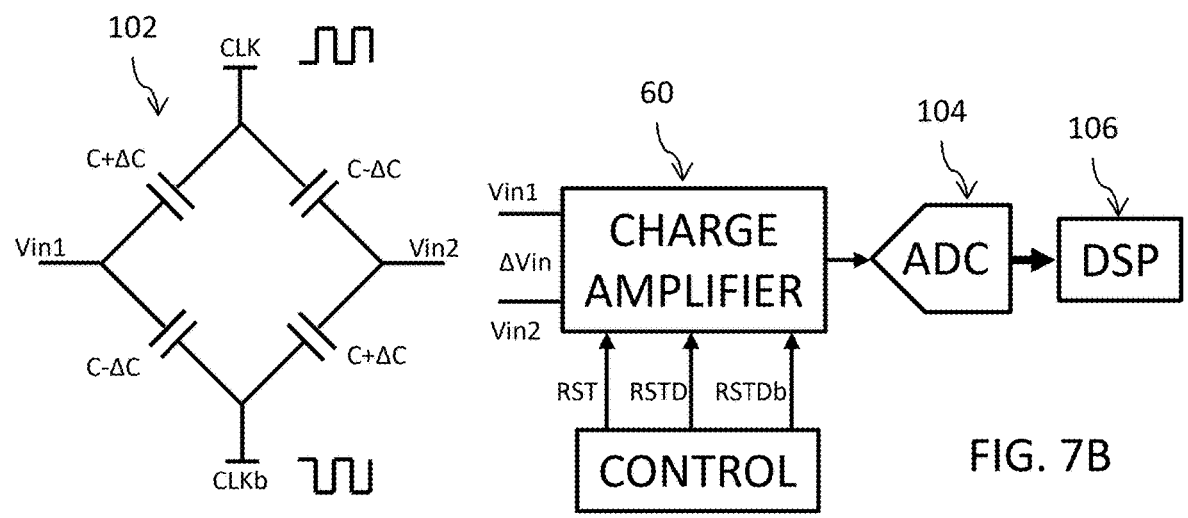

Reference is now made to FIGS. 7A and 7B which each show a block diagram of a sensing circuit configured to utilize the charge amplification circuit of FIG. 3. In FIG. 7A, the sensor 100 is a resistive bridge circuit with input bridge nodes powered between a supply voltage Vbridge and ground. The output bridge nodes of sensor 100 produce a sense voltage ΔVin that is given by:

$$\Delta Vin = Vbridge \times \frac{\Delta R}{R}$$

Where: the change in resistance ΔR is a function of change in the physical quantity being sensed by the sensor 100 (for example, pressure), and wherein ΔR is proportional to the change in the physical quantity.

In FIG. 7B, the sensor 102 is a capacitive bridge circuit with input bridge nodes powered between clock signals CLK and CLKb that are 180° out of phase with each other and have a voltage magnitude of Vbridge. The output bridge nodes of sensor 102 produce a sense voltage ΔVin that is given by:

$$\Delta Vin = Vbridge \times \Delta C$$

Where: that change in capacitance ΔC is a function of change in the physical quantity being sensed by the sensor 102 (for example, pressure), and wherein ΔC is proportional to the change in the physical quantity.

The output bridge nodes of sensor 100, 102 with sense voltage ΔVin are connected to the input nodes Vin1 and Vin2 of the charge amplification circuit 60. The sensor 100, 102 bridge circuit may, for example, be implemented using MEMS technology. The differential output voltage from the charge amplification circuit 60 is converted to a digital signal by an analog to digital converter (ADC) circuit 104. The digital signal is then processed by a digital signal processing (DSP) circuit 106 to generate a data signal indicative of the physical quantity (for example, pressure) being sensed by the sensor 100, 102. A control circuit 108 generates the control signaling (RST, RSTD, RSTDb) necessary for the multi-phase startup as explained above.

An advantage of the complete cancelation of the offset voltage Vofs of the OTA 62 in the charge amplification circuit 60 is that this allows for the maximization of the input dynamic range of the ADC circuit. A further advantage of this dynamic offset voltage cancellation is that it allows the system to operate with a balanced fully differential signal chain which improves the rejection of common-mode noise.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
   an amplifier having a first input node and a second input node and having a first output node and a second output node;
   a bias voltage node;
   a first set of switches configured, in response to assertion of a first reset signal, to couple the first and second input nodes of the amplifier to the bias voltage node and to short circuit the first and second output nodes of the amplifier together;
   a first feedback branch coupled between the first output node and the first input node of the amplifier, the first feedback branch including:
      a first capacitor; and
      a second capacitor having a first terminal directly connected to the first input node of the amplifier;
   a second feedback branch coupled between the second output node and the second input node of the amplifier, the second feedback branch including:
      a third capacitor; and
      a fourth capacitor having a first terminal directly connected to the second input node of the amplifier;
   wherein each of the first and second feedback branches further includes:
      a second set of switches intermediate the first and second input nodes of the amplifier and the first and third capacitors; and
      a third set of switches intermediate the first and second output nodes of the amplifier and the first, second, third and fourth capacitors;
   wherein:
      switches in the second set of switches are configured to selectively couple the first capacitor in the first feedback branch and the third capacitor in the second feedback branch to the first and second input nodes of the amplifier, respectively, in response to assertion of a second reset signal; and
      switches in the third set of switches are configured to selectively couple the first capacitor in the first feedback branch and the third capacitor in the second feedback branch to the first and second output nodes of the amplifier, respectively, in response to assertion of the second reset signal; and
      wherein the first and second reset signals are asserted during a first phase, and wherein the first reset signal is de-asserted and the second reset signal is asserted during a second phase after the first phase.

2. The circuit of claim 1, wherein:
   switches in the second set of switches are further configured to selectively couple the first capacitor in the first feedback branch and the third capacitor in the second feedback branch to the bias voltage node in response to assertion of a third reset signal; and
   switches in the third set of switches are further configured to selectively couple the first capacitor in the first feedback branch and the third capacitor in the second feedback branch to the bias voltage node in response to assertion of the third reset signal; and
   wherein the first reset signal is de-asserted, the second reset signal is de-asserted and the third reset signal is asserted during a third phase after the second phase.

3. The circuit of claim 1, wherein:
   switches in the third set of switches are further configured to selectively couple the second capacitor in the first feedback branch and the fourth capacitor in the second feedback branch to the bias voltage node in response to assertion of the second reset signal;
   switches in the third set of switches are further configured to selectively couple the second capacitor in the first feedback branch and the fourth capacitor in the second feedback branch to the first and second output nodes of the amplifier, respectively, in response to assertion of a third reset signal; and
   wherein the first reset signal is de-asserted, the second reset signal is de-asserted and the third reset signal is asserted during a third phase after the second phase.

4. The circuit of claim 3, wherein:
   a voltage at the first and second output nodes of the amplifier at an end of the second phase is equal to:

$$\left(1 + \frac{Ctot + CF2}{CF1}\right)Vofs$$

and the voltage at the first and second output nodes of the amplifier at an end of the third phase is equal to:

$$\left(1 + \frac{Ctot}{CF1}\right)Vofs - \frac{Ctot}{CF2}Vofs - Vofs = 0$$

where: Ctot is a total capacitance of a virtual ground at the first and second input nodes of the amplifier, CF1 is a capacitance of the first and third capacitors, CF2 is a capacitance of the second and fourth capacitors, and Vofs is a voltage offset of the amplifier.

5. The circuit of claim 3, wherein:
   switches in the second set of switches are further configured to selectively couple the first capacitor in the first feedback branch and the third capacitor in the second feedback branch to the bias voltage node in response to assertion of the third reset signal; and switches in the third set of switches are further configured to selectively couple the first capacitor in the first feedback branch and the third capacitor in the second feedback branch to the bias voltage node in response to assertion of the third reset signal.

6. The circuit of claim 3, wherein the first, second and third phases are phases of a process for resetting the circuit following a power off.

7. The circuit of claim 1, wherein the amplifier is a fully differential operational trans-conductance amplifier (OTA).

8. The circuit of claim 1, wherein the second feedback branch is a replica of the first feedback branch.

9. The circuit of claim 1, wherein:
the first feedback branch includes a parallel connection of the first capacitance, the second capacitance and a first resistance; and
the second feedback branch includes a parallel connection of the third capacitance, the fourth capacitance and a second resistance.

10. The circuit of claim 1, further comprising:
a first input capacitor coupled between the first input node of the amplifier and a first sensor node; and
a second input capacitor coupled between the second input node of the amplifier and a second sensor node.

11. The circuit of claim 10, wherein said first set of switches is further configured, in response to assertion of the first reset signal, to couple the first and second sensor nodes to the bias voltage node.

12. The circuit of claim 10, further comprising a sensor configured to sense a physical quantity having signal outputs coupled to the first and second sensor nodes.

13. The circuit of claim 12, wherein the sensor is a capacitive bridge sensor.

14. The circuit of claim 12, wherein the sensor is a resistive bridge sensor.

15. The circuit of claim 1, further comprising an analog to digital converter circuit having a differential input coupled to the first and second output nodes of the amplifier.

16. The circuit of claim 15, further comprising a digital signal processor having an input coupled to receive a digital signal output from the analog to digital converter circuit.

17. The circuit of claim 1, wherein a voltage at the first and second output nodes of the amplifier at an end of the second phase is equal to:

$$\left(1 + \frac{Ctot + CF2}{CF1}\right) Vofs$$

where: Ctot is a total capacitance of a virtual ground at the first and second input nodes of the amplifier, CF1 is a capacitance of the first and third capacitors, CF2 is a capacitance of the second and fourth capacitors, and Vofs is a voltage offset of the amplifier.

18. The circuit of claim 1, wherein the first and second phases are phases of a process for resetting the circuit following a power off.

19. The circuit of claim 1, wherein the first feedback branch further comprises a first resistor directly connected between the first output node and the first input node of the amplifier and wherein the second feedback branch further comprises a second resistor directly connected between the second output node and the second input node of the amplifier.

* * * * *